US007173364B2

(12) United States Patent
Kim

(10) Patent No.: US 7,173,364 B2
(45) Date of Patent: Feb. 6, 2007

(54) CATHODE RAY TUBE AND ANODE BUTTON POSITIONED ON FUNNEL THEREFOR

(75) Inventor: Ryo Hyang Kim, Jinju-si (KR)

(73) Assignee: LG. Philips Displays Korea Co., Ltd., Kumi-Si (KR)

( * ) Notice: Subject to any disclaimer, the term of this patent is extended or adjusted under 35 U.S.C. 154(b) by 0 days.

(21) Appl. No.: 11/316,981

(22) Filed: Dec. 27, 2005

(65) Prior Publication Data

US 2006/0192472 A1 Aug. 31, 2006

(30) Foreign Application Priority Data

Dec. 28, 2004 (KR) ...................... 10-2004-0113562

(51) Int. Cl.
*H01L 29/92* (2006.01)
*H01J 29/96* (2006.01)

(52) U.S. Cl. .......................... 313/477 HC; 313/477 R; 315/3

(58) Field of Classification Search ............ 313/477 R, 313/477 HC
See application file for complete search history.

(56) References Cited

U.S. PATENT DOCUMENTS 4,471,264 A * 9/1984 Matsuzaki et al. ............. 315/3
5,155,411 A * 10/1992 Swank et al. ........... 313/477 R
6,329,747 B1 * 12/2001 Noguchi et al. ............ 313/414
6,608,645 B2 * 8/2003 Kunitake .................... 348/173
6,653,774 B2 * 11/2003 Kunitomo et al. ...... 313/477 R
6,794,808 B2 * 9/2004 In et al. .................. 313/477 R
7,098,585 B2 * 8/2006 Baek et al. ............. 313/477 R
2002/0153823 A1 * 10/2002 Hergott et al. .......... 313/477 R
2002/0190632 A1 * 12/2002 In et al. .................. 313/477 R
2003/0030363 A1 * 2/2003 Kunitake ................ 313/477 R
2006/0076874 A1 * 4/2006 Nishiyama .................. 313/479

* cited by examiner

*Primary Examiner*—Nimeshkumar D. Patel
*Assistant Examiner*—Peter Macchiarolo
(74) *Attorney, Agent, or Firm*—Birch, Stewart, Kolasch & Birch, LLP

(57) ABSTRACT

Disclosed are a cathode ray tube and a funnel therefore. An anode button is installed on the funnel to meet the condition of 2.8≦T, in which T is a B/A ratio, A is a distance on a central axis of the funnel between a seal edge face of the funnel, which abuts a panel, and the anode button, and B is a distance on the central axis of the funnel between the anode button and a neck seal of the funnel, which is positioned at the opposite side of the seal edge face in the funnel. According to this invention, it is possible to prevent mechanical interference and electrical interference, such as distortion of deflection magnetic field, caused depending on the installation position of the anode button on the funnel.

19 Claims, 3 Drawing Sheets

CATHODE RAY TUBE AND ANODE BUTTON POSITIONED ON FUNNEL THEREFOR

CROSS-REFERENCE TO RELATED APPLICATIONS

This application claims priority from Korean Patent Application No. 2004-113562, filed on Dec. 28, 2004, in the Korean Intellectual Property Office, the disclosure of which is incorporated herein by reference.

BACKGROUND OF INVENTION

1. Field of Invention

The present invention relates to a cathode ray tube and a funnel therefore. More particularly, the present invention relates to a cathode ray tube and a funnel included in the cathode ray tube, in which an installation position of an anode button to which a high voltage is applied is optimized in order to respond to slimming trend in which length overall becomes shorter.

2. Description of the Related Art

Generally, a cathode ray tube (CRT) is a display device for realizing a certain image by emitting electron beams corresponding to electric signals so as to hit a phosphor screen, thereby converting the electron beams to an optical image.

FIG. 1 is a sectional view illustrating the structure of a cathode ray tube according to a related art.

As shown in FIG. 1, the related art cathode ray tube includes a panel 2, a screen 4 installed inside the panel 2 and coated with a phosphor, a funnel 6 coupled to a rear surface of the panel 2, an electro gun 8 connected to a rear portion of the funnel 4 for emitting electron beams toward the phosphor on the screen 4, a deflection yoke 10 for deflecting the electron beams emitted from the electron gun 8, and a shadow mask 12 mounted on a rear side of the panel 2 for selecting a color of the deflected electron beam.

The operation of the above described cathode ray tube is described in detail with reference to FIG. 1.

Electron beam is accelerated and converged while passing through each electrode of the electron gun 8, and the accelerated and converged electron beam is deflected by the deflection yoke 10 installed in the panel 6 while moving toward the panel 6.

The deflected electron beam passes through a slot of the shadow mask 12 and hits the phosphor on the phosphor screen 4. At this time, the phosphor on the phosphor screen 4 is excited due to energy of the electron beam and irradiates visible light rays, thereby forming an image on the phosphor screen 4.

FIG. 2 is a sectional view illustrating some important portion of the cathode ray tube according to a related art.

As shown in FIG. 2, an anode button 20 for transferring a high voltage, for example about 30 Kv, to the electron gun is installed to the funnel 6 so that the electron beam emitted from the electron gun is accelerated and converged toward the screen, and an insulator 22 is installed to an exterior of the funnel 6 in such a manner of surrounding the anode button 20.

A value A is a distance on the central axis of the funnel between a seal edge (SE) face of the funnel 6, which abuts the panel 2, and the center of the anode button 20. On the other hand, A value B is a distance on the central axis of the funnel between a neck seal (NS) of the funnel 6, disposed at the opposite side of the seal edge of the funnel 6, and the center of the anode button 20. A value T is a B to A ratio (B/A), and the anode button is disposed to meet the condition of $2 \leqq T < 2.8$.

The insulator 22 is generally formed of a nonconductive material, such as silicon, and its minimum size is limited in the range of capable of insulating the anode button 20.

Recently, as the cathode ray tubes are getting larger and slimmer due to severe competitiveness, technologies for reducing length overall of the cathode ray tubes are being developed. Still, in the case in which the anode button 20 is designed to be disposed at a position which meets the condition $2 \leqq T < 2.8$, there is a problem in that the anode button 20 and the insulator 22 can mechanically interfere with the deflection yoke 10 since the anode button 20 and the deflection yoke 10 are positioned so close to each other. That is, sizes of the anode button 20, the insulator 22 and the deflection yoke 10 are limited or it is difficult to install the anode button 20, the insulator 22 and the deflection yoke 10 due to the small installation space.

Further, since the anode button 20 and the deflection yoke 10 are positioned so close to each other, a high voltage applied to the anode button 20 affects deflection magnetic field generated from the deflection yoke 10, resulting in distortion of the deflection magnetic field. This results in screen distortion as shown in FIG. 3.

SUMMARY OF THE INVENTION

Accordingly, the present invention is provided to solve the above described disadvantages and problems. An aspect of the present invention is to provide a cathode ray tube and a funnel included in the cathode ray tube, in which an installation position of an anode button on the funnel is optimized not to cause mechanical and electrical interferences.

According to an aspect of the present invention, there is provided a cathode ray tube comprising a funnel attached to a panel and an anode button installed at a predetermined position of the funnel, wherein an installation position of the anode button is determined in the funnel to meet the condition of $2.8 \leqq T$, in which T is a B/A ratio, A is a distance on a central axis of the funnel between a seal edge face of the funnel, which abuts the panel, and the anode button, and B is a distance on the central axis of the funnel between the anode button and a neck seal of the funnel, which is positioned at the opposite side of the seal edge face in the funnel.

The cathode ray tube is structured to meet the condition of $T \leqq 4.5$.

The cathode ray tube is structured to meet the condition of $40\text{ mm} \leqq A \leqq 70\text{ mm}$.

The funnel is provided with an insulator for insulating the anode button, in which the insulator is designed to meet the condition of $50\text{ mm} \leqq Rm \leqq 60\text{ mm}$, Rm being the longest length in the insulator.

According to another aspect of the present invention, there is provided a cathode ray tube having a length overall of 350 mm or less, wherein an installation position of an anode button on a funnel is determined to meet the condition of $2.8 \leqq T$, in which T is a B/A ratio, A is a distance on a central axis of the funnel between a seal edge face of the funnel, which abuts a panel, and the anode button, and B is a distance on the central axis of the funnel between the anode button and a neck seal of the funnel, which is positioned at the opposite side of the seal edge face in the funnel.

The cathode ray tube is structured to meet the condition of $T \leqq 4.5$.

The cathode ray tube is structured to meet the condition of 40 mm≦A≦70 mm.

The funnel is provided with an insulator for insulating the anode button, in which the insulator is designed to meet the condition of 50 mm≦Rm≦60 mm, Rm being the longest length of the insulator.

According to further another aspect of the present invention, there is provided a cathode ray tube having an electron beam deflection angle of 120 degrees or more, wherein an installation position of an anode button on a funnel is determined to meet the condition of 2.8≦T, in which T is a B/A ratio, A is a distance on a central axis of the funnel between a seal edge face of the funnel, which abuts a panel, and the anode button, and B is a distance on the central axis of the funnel between the anode button and a neck seal of the funnel, which is positioned at the opposite side of the seal edge face in the funnel.

The funnel is provided with an insulator designed to meet the condition of 50 mm≦Rm≦60 mm, Rm being the longest length of the insulator.

The cathode ray tube has length overall of 350 mm or less.

The cathode ray tube is structured to meet the condition of T≦4.5.

The cathode ray tube is structured to meet the condition of 40 mm≦A≦70 mm.

The funnel is provided with an insulator for insulating the anode button, in which the insulator is designed to meet the condition of 50 mm≦Rm≦60 mm, Rm being the longest length of the insulator.

According to still further aspect of the present invention, there is provided a cathode ray tube having an electron beam deflection angle of 120 degrees or more and length overall of 350 mm or less, wherein an installation position of an anode button on a funnel is determined to meet the condition of 2.8≦T, in which T is a B/A ratio, A is a distance on a central axis of the funnel between a seal edge face of the funnel, which abuts a panel, and the anode button, and B is a distance on the central axis of the funnel between the anode button and a neck seal of the funnel, which is positioned at the opposite side of the seal edge face in the funnel.

The cathode ray tube is structured to meet the condition of T≦4.5.

The cathode ray tube is structured to meet the condition of 40 mm≦A≦70 mm.

The funnel is provided with an insulator for insulating the anode button, in which the insulator is designed to meet the condition of 50 mm≦Rm≦60 mm, Rm being the longest length in the insulator.

The funnel is provided with an insulator for insulating the anode button, in which the funnel is designed to meet the conditions of T≦4.5, 40 mm≦A≦70 mm, and 50 mm≦Rm≦60 mm, Rm being the longest length in the insulator.

BRIEF DESCRIPTION OF THE DRAWINGS

The above and/or other aspects and advantages of the prevent invention will become apparent and more readily appreciated from the following description of the exemplary embodiments, taken in conjunction with the accompany drawings, in which.

DETAILED DESCRIPTION OF THE INVENTION

Figure 1:
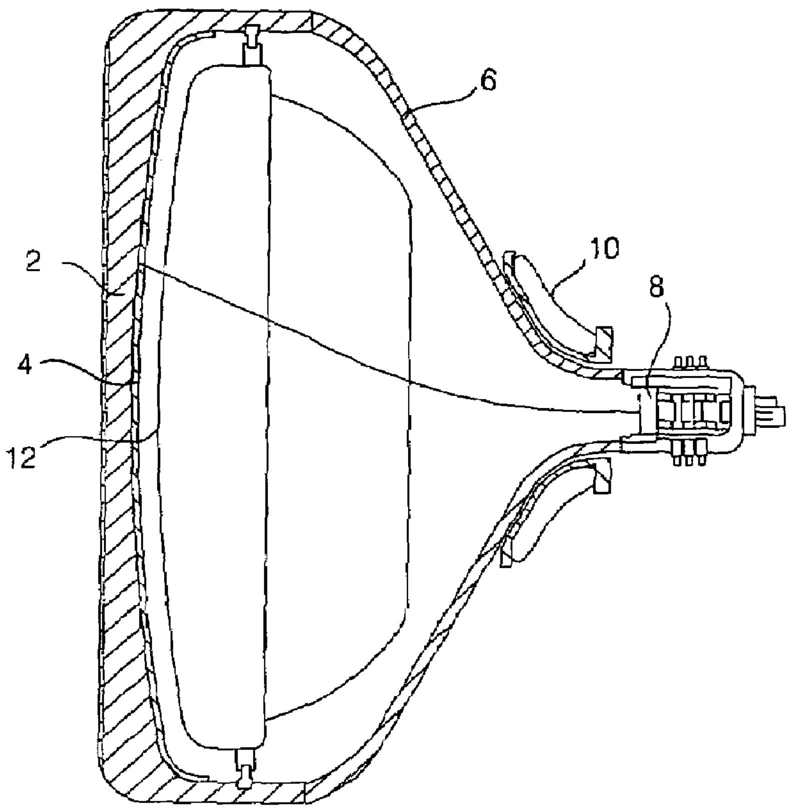
FIG. 1 (Prior Art)
FIG. 1 is a sectional view illustrating the interior of a typical cathode ray tube.
Figure 2:
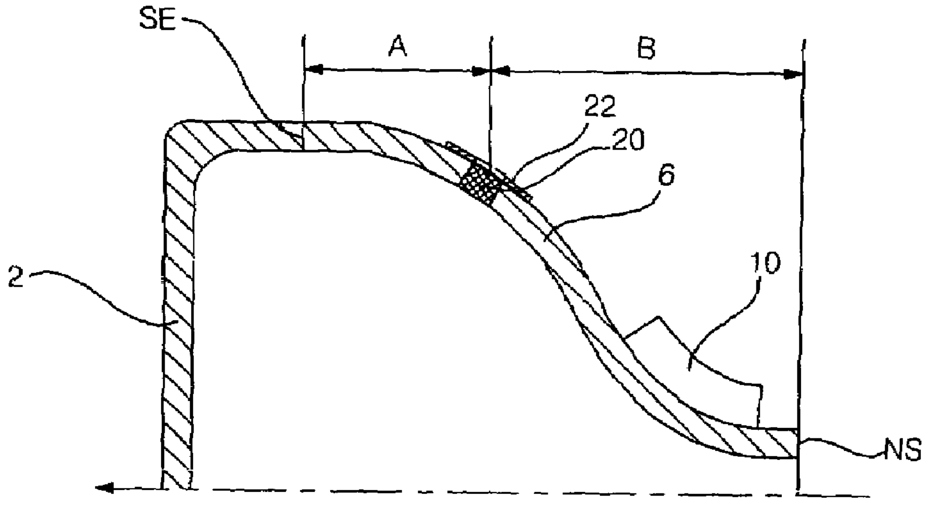
FIG. 2 (Prior Art)
FIG. 2 is a sectional view illustrating some important portion of a related art cathode ray tube.
Figure 3:
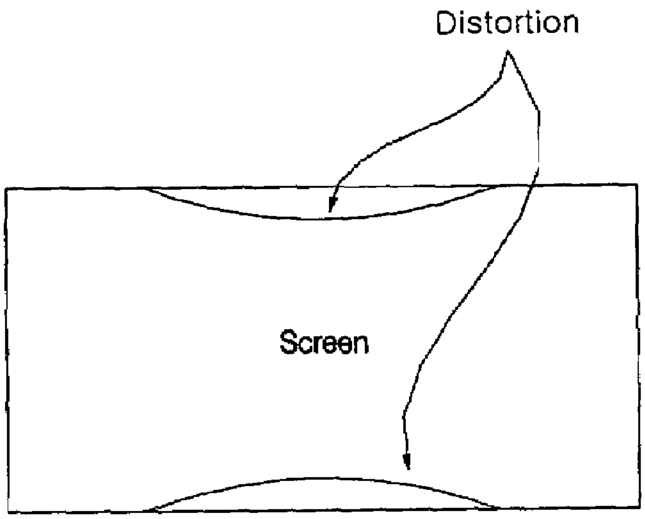
FIG. 3 (Prior Art)
FIG. 3 is a schematic view illustrating screen distortion.

Reference will now be made in detail to the embodiments of the present invention, examples of which are illustrated in the accompanying drawings, wherein like reference numerals refer to like elements throughout. The embodiments are described below so as to explain the present invention by referring to the figures.

Hereinafter, a cathode ray tube and a funnel for the cathode ray tube according to embodiments of the present invention will be described with reference to figures.

There may be a plurality of cathode ray tubes and funnels according to embodiments of the present invention. Hereinafter, the cathode ray tube and the funnel according to the most preferable embodiment will be described. In the cathode ray tube and the funnel of the present invention, basic structures of the cathode ray tube and the funnel are the same as in the conventional cathode ray tubes and the funnel. Accordingly, description on the structure of the cathode ray tube and the funnel will be omitted.

Figure 4:
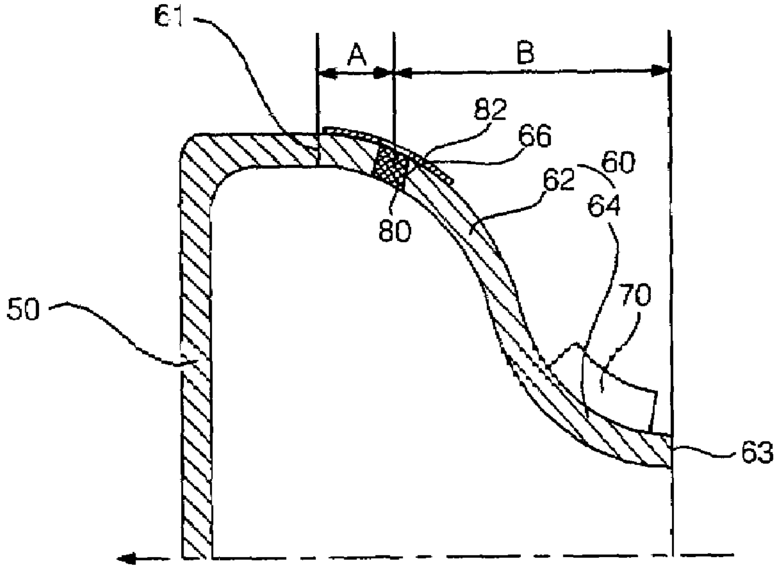
FIG. 4 is a sectional view illustrating a cathode ray tube and a funnel for the cathode ray tube according an embodiment of the present invention.
Figure 6:
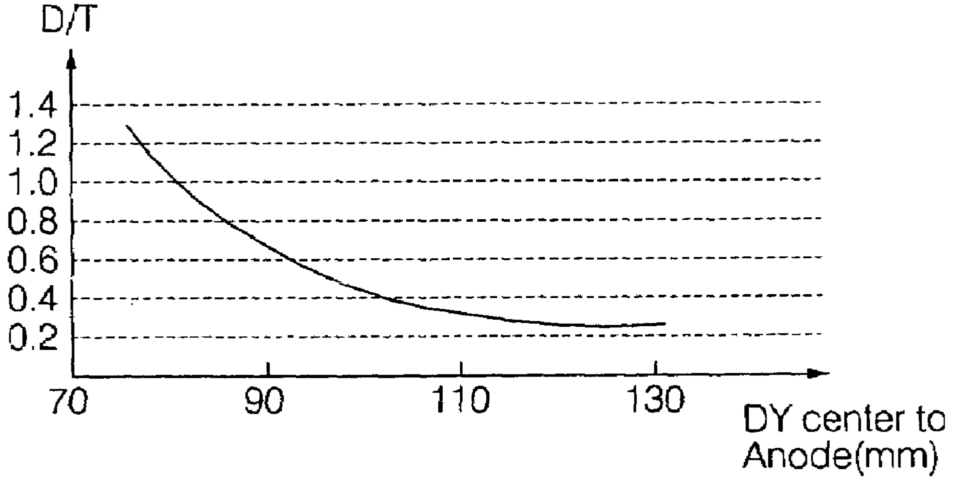
FIG. 6 is a graph illustrating the degree of screen distortion according to positions of an anode button.

FIG. 4 illustrates a sectional view of a cathode ray tube and a funnel according to an embodiment of the present invention, and FIG. 6 illustrates a front view of the cathode ray tube and the funnel according to an embodiment of the present invention.

Figure 5:
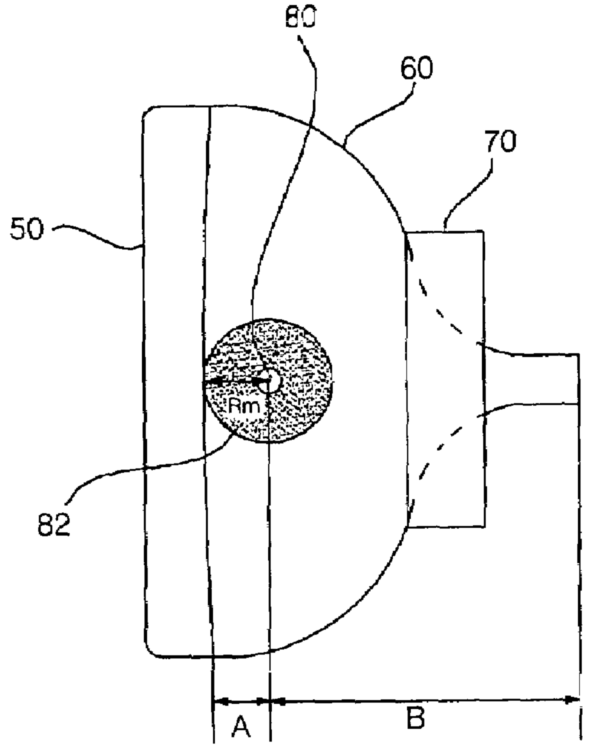
FIG. 5 is a front view illustrating the cathode ray tube and the funnel for the cathode ray tube according to the embodiment of the present invention.

Referring to FIG. 4 and FIG. 5, the cathode ray tube 50 is called a slim-type cathode ray tube, in which a funnel 60 is attached to a rear side of a panel 50 such that the cathode ray tube an electron beam deflection angle of 120 degrees or more and the length overall of 350 mm or less which is greatly shorter than that of the related art cathode ray tubes.

The length overall of the cathode ray tube is a length of the longest straight line extending from the front end to the rear end of a tube which is constituted by attaching the funnel 60 to the panel 50.

The funnel 60 of the cathode ray tube includes a body part 62 which is a front portion and a neck part 64 which is a rear portion, in which a deflection yoke 70 is installed outside the neck part 64 and an electron gun is provided inside the neck part 64.

The funnel 60 has a seal edge face 61 which is the front face abutting the panel 50, and a neck seal 63 which is the rear face which is opposite to the seal edge face 61 in the back-to-front direction.

The funnel 60 further includes an anode button-hole 66 to receive an anode button 80 therein at a location in front of the deflection yoke 70, in which the anode button 80 transfers a high voltage, typically 30 Kv, to the electron gun. The anode button 80 is installed in the anode button-hole 66. An insulator 82 is applied on the funnel for insulating the anode button 80.

Here, the installation position of the anode button 80 is needed to be optimally determined, considering correlation among size of the anode button 80, a voltage applied to the anode button 80, a distance between the anode button 80 and the electron gun, interference with the deflection yoke 70, size of the insulator 82, size of the tube 50' and so on.

Accordingly, the installation position of the anode button 80 is determined to meet the condition of 2.8≦T, in which a value T is a B to A (B/A) ratio, wherein a value A is a distance on the central axis of the funnel in the back-to-front direction between the seal edge face 61 of the funnel 60 and the center of the anode button 80, and a value B is a distance on the central axis of the funnel in the back-to-front direction between the center of the anode button 80 and the neck seal 63

In the case in which the installation position of the anode button 80 is determined through the above described correlation, it is found that the anode button 80 is positioned, having a sufficient distance from the deflection yoke 70 as shown in table 1.

TABLE 1

| | 32" FLAT | 28" FLAT | 29" FLAT | 32" SLIM-2 |
|---|---|---|---|---|
| A (mm) | 12.4 | 87.0 | 100.9 | 58.0 |
| B (mm) | 256.6 | 239.5 | 235.9 | 204.0 |
| A + B (mm) | 380.3 | 326.5 | 336.8 | 262.0 |
| T = B/A | 2.05 | 2.75 | 2.34 | 3.52 |

In table 1, the 32" FLAT, 28" FLAT and 29" FLAT FCDs are related art cathode ray tubes, and 32" SLIM is the cathode ray tube according to the present invention.

Referring to table 1, in the 32" FLAT, 28" FLAT and 29" FLAT FCDs, the conventional cathode ray tubes, a value A+B, which is the sum of the distance on the central axis of the funnel between the seal edge face 61 of the funnel and the center of the anode button 80 and the distance on the central axis between the neck seal 63 of the funnel 60 and the center of the anode button 80, i.e., the length overall of the funnel 60, is large enough. Accordingly, lo the anode button 80 can be disposed away enough from the deflection yoke 70 even if the value T is small, because the value B, which is the distance on the central axis of the funnel 60 between the center of the anode button 80 and the neck seal 63, is large.

Referring to table 1, in the 32" SLIM, the cathode ray tube according to the present invention, it is found that the anode button 80 is disposed apart enough from the deflection yoke 70 like the conventional cathode ray tubes, since the installation position of the anode button 80 is determined to meet the condition of 2.8≦T, the value A, which is the distance on the central axis of the funnel 60 between the seal edge 61 of the panel 60 and the center of the anode button 80, is about 58.0 mm, and the value B, which is the distance on the central axis between the center of the anode button 80 and the neck seal 63 of the funnel 60 is about 204.0 mm, For reference, in the 32" cathode ray tube having a electron beam deflection angle of 120 degrees or more and the funnel length overall of about 262.0 mm, in the case in which the installation position of the anode button 80 is determined to meet the condition of T=2.8, the anode button 80 and the deflection yoke 70 becomes closer to each other by about 10 mm since the value B, which is the distance on the central axis between the neck seal 63 of the funnel 60 and the anode button 80, is about 194.39 mm, Accordingly, in the case in which the anode button 80 is positioned to meet the condition of 2.8≦T, mechanical interference between the anode button 80 and the insulator 82, and the deflection yoke 70 is avoidable. As a result, it is possible to alleviate design limitation of the anode button 80 and the insulator 82, such as size of the anode button 80.

Generally, electric field is in inverse proportional to the square of a distance. By the way, since the anode button 80 is disposed to meet the condition of 2.8≦T, the distance of the anode button 80 and the deflection yoke 70 is long enough. Accordingly, intensity of electric field which can affect the deflection magnetic field of the deflection yoke 70 is remarkably reduced when the electric field reaches the deflection yoke. In other words, referring to FIG. 7, as the distance (DY center to anode) between the anode button 80 and the deflection yoke 70 becomes longer, distortion D/T becomes reduced, thereby capable of preventing screen distortion.

The installation position of the anode button 80 is preferably determined, considering correlation among a variety of factors including a voltage applied the anode button.

That is, in order to assuredly preventing conductance at a high voltage applied to the anode button 80, the insulator 82 is designed to preferably meet the condition of 50 mm≦Rm≦60 mm, in which Rm is the length of the longest straight line between the center of the anode button 80 and an edge of the insulator 82.

The insulator 82 can be formed into a variety of shapes, and preferably formed into a ring shape in which the insulator 82 is preferably installed such that its center is coincident with the center of the anode button 80. In the case in which the insulator 82 is a ring shape, Rm is an external radius of the insulator 82.

When the insulator 82 designed to meet the condition of 50 mm≦Rm≦60 mm is installed to the funnel 60, A, which is the distance on the central axis between the seal edge face 61 of the funnel 60 and the center of the anode button 80, should be 40 mm at least in order to prevent mechanical interference between the insulator 82 and the panel 50.

Accordingly, it is desired that the installation position of the anode button 80 should meet the condition of T≦4.5 as well as the condition of 2.8≦T.

On the other hand, the cathode ray tube is constituted such that mechanical interference between the insulator 82 and the panel 50 is avoidable as well as the anode button 80 and the deflection yoke 70 are disposed apart by the enough distance.

As described above, while the cathode ray tube and the funnel thereof according to the embodiment of the present invention are described with reference to figures, the cathode ray tube and the funnel thereof according to the present invention are not limited to the embodiments and figures and can be modified without departing from the technical principles and spirit of the invention.

As described above, the cathode ray tube and the funnel thereof has the advantage in which mechanical interference and electrical interference, such as distortion of deflection magnetic field, are prevented since the installation position of the anode button is optimally determined, considering the correlation among the length overall of the cathode ray tube, interference with the deflection yoke, interference with the insulator, size of the insulator and electric resistance.

What is claimed is:

1. A cathode ray tube comprising:

a funnel attached to a panel; and an anode button installed at a predetermined position of the funnel, wherein an installation position of the anode button is determined in the funnel to meet the condition of 2.8≦T, in which T is a B/A ratio, A is a distance on a central axis of the funnel between a seal edge face of the funnel, which abuts the panel, and the anode button, and B is a distance on the central axis of the funnel between the anode button and a neck seal of the funnel, which is positioned at the opposite side of the seal edge face in the funnel.

2. The cathode ray tube as claimed in claim 1, wherein the cathode ray tube is structured to meet the condition of 2.8≦T≦4.5.

3. The cathode ray tube as claimed in claim 1, wherein the cathode rat tube is structured to meet the condition of 40 mm≦A≦70 mm.

4. The cathode ray tube as claimed in claim 1, wherein an insulator is applied onto the funnel so as to insulate the anode button, and the insulator is designed to meet the condition of 50 mm≦Rm≦60 mm, Rm being the longest length in the insulator.

5. A cathode ray tube having a length overall of 350 mm or less, wherein an installation position of an anode button on a funnel is determined to meet the condition of 2.8≦T, in which T is a B/A ratio, A is a distance on a central axis of the funnel between a seal edge face of the funnel, which abuts a panel, and the anode button, and B is a distance on the central axis of the funnel between the anode button and a neck seal of the funnel, which is positioned at the opposite side of the edge face in the funnel.

6. The cathode ray tube as claimed in claim 5, wherein the cathode ray tube is structured to meet the condition of 2.8≦T≦4.5.

7. The cathode ray tube as claimed in claim 5, wherein the cathode ray tube is structured to meet the condition of 40 mm≦A≦70 mm.

8. The cathode ray tube as claimed in claim 5, wherein an insulator is applied onto the funnel to insulate the anode button, and the insulator is designed to meet the condition of 50 mm≦Rm≦60 mm, Rm being th longest length of the insulator.

9. A cathode ray tube having an electron beam deflection angle of 12 degrees or more, wherein an installation position of an anode button on a funnel is determined to meet the condition of 2.8≦T, in which T is a B/A ratio, A is a distance on a central axis of the funnel between a seal edge face of the funnel, which abuts a panel, and the anode button, and B is a distance on the central axis of the funnel between the anode button and a neck seal of the funnel, which is positioned at the opposite side of the seal edge face in the funnel.

10. The cathode ray tube as claimed in claim 9, wherein an insulator is applied onto the funnel and is designed to meet the condition of 50 mm≦Rm≦60 mm, Rm being the longest length of the insulator.

11. The cathode ray tube as claimed in claim 9, wherein length overall of the cathode ray tube is 350 mm or less.

12. The cathode ray tube as claimed in claim 9, wherein the cathode ray tube is structured to meet the condition of 2.8≦T≦4.5.

13. The cathode ray tube as claimed in claim 9, wherein the cathode ray tube is structured to meet the condition of 40 mm≦A≦70 mm.

14. The cathode ray tube as claimed in claim 9, wherein an insulator is applied onto the funnel to insulate the anode button, and it is designed to meet the condition of 50 mm≦Rm≦60 mm, Rm being the longest length of the insulator.

15. A cathode ray tube having an electron beam deflection angle of 120 degrees or more and length overall on 350 mm or less, wherein an installation position of an anode button on a funnel is determined to meet the condition of 2.8≦T, in which T is a B/A ratio, A is a distance on a central axis of the funnel between a seal edged face of the funnel, which abuts a panel, and the anode button, and B is a distance on the central axis of the funnel between the anode button and a neck seal of the funnel, which is positioned at the opposite side of the seal edge face in the funnel.

16. The cathode ray tube as claimed in claim 15, wherein the cathode ray tube is structured to meet the condition of 2.8≦T≦4.5.

17. The cathode ray tube as claimed in claim 15, wherein the cathode ray tube is structured to meet the condition of 40 mm≦A≦70 mm.

18. The cathode ray tube as claimed in claim 15, wherein an insulator is applied onto the funnel to insulate the anode button, and it is designed to meet the condition of 50 mm≦Rm≦60 mm, Rm being th longest length in the insulator.

19. The cathode ray tube as claimed in claim 15, wherein and insulator is applied onto the funnel to insulate the anode button, and the funnel is designed to meet the conditions of 2.8≦T≦4.5, 40 mm≦A≦70 mm, and 50 mm≦Rm≦60 mm, Rm being the longest length in the insulator.

* * * * *